US007472477B2

(12) United States Patent
Beaman et al.

(10) Patent No.: US 7,472,477 B2
(45) Date of Patent: Jan. 6, 2009

(54) METHOD FOR MANUFACTURING A SOCKET THAT COMPENSATES FOR DIFFERING COEFFICIENTS OF THERMAL EXPANSION

(75) Inventors: Brian Samuel Beaman, Apex, NC (US); Joseph Kuczynski, Rochester, MN (US); Theron Lee Lewis, Rochester, MN (US); Amanda Elisa Ennis Mikhail, Rochester, MN (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 11/548,797

(22) Filed: Oct. 12, 2006

(65) Prior Publication Data

US 2008/0090439 A1 Apr. 17, 2008

(51) Int. Cl.
*H05K 3/34* (2006.01)

(52) U.S. Cl. ............................ 29/840; 29/843; 29/876; 29/739; 29/760; 39/637

(58) Field of Classification Search .................. 29/832, 29/842, 844, 845, 874, 876, 884, 840, 739, 29/760; 439/66, 67, 260, 465, 567, 630, 439/637, 61
See application file for complete search history.

(56) References Cited

U.S. PATENT DOCUMENTS 4,713,013 A 12/1987 Regnier et al.
5,049,087 A 9/1991 Chung et al.
5,145,381 A 9/1992 Volz
5,145,395 A 9/1992 Kuei Lai
5,171,154 A * 12/1992 Casciotti et al. ............... 439/67
5,273,442 A 12/1993 Laub
5,451,815 A 9/1995 Taniguchi et al.
5,584,728 A * 12/1996 Cheng ........................ 439/637
5,704,807 A 1/1998 Sherman et al.
6,021,048 A 2/2000 Smith
6,139,336 A 10/2000 Olson
6,168,464 B1 1/2001 Choy et al.
6,203,338 B1 3/2001 Choy
6,302,705 B1 10/2001 Yatskov et al.
6,431,889 B1 8/2002 Olson
6,454,157 B2 9/2002 Olson
6,498,551 B1 12/2002 Ammar et al.
6,558,181 B2 5/2003 Chung et al.
6,857,908 B2 2/2005 Burmeister
2003/0171014 A1 9/2003 Lin

* cited by examiner

*Primary Examiner*—Donghai D. Nguyen
(74) *Attorney, Agent, or Firm*—Duke W. Yee; Gregory M. Doudnikoff; Peter B. Manzo

(57) ABSTRACT

The illustrative embodiments provide a method for manufacturing a socket and attaching the socket to a printed circuit board. Surface mounted contacts for a bottom surface of a socket are provided. The surface mounted contacts are a plurality of conductive metal pads that directly attach to surface connections on a printed circuit board. An elongated housing is formed comprising at least two members that are coupled together and disposed to form an aperture in between the at least two members. At least one dimension of the at least two members is selected to compensate for a difference between coefficients of thermal expansion between the socket and the printed circuit board. The at least two members and the surface mounted contacts are aligned with the printed circuit board using a clip. In response to completing a solder reflow process, the clip is removed and a module is inserted into the aperture.

5 Claims, 3 Drawing Sheets

METHOD FOR MANUFACTURING A SOCKET THAT COMPENSATES FOR DIFFERING COEFFICIENTS OF THERMAL EXPANSION

BACKGROUND OF THE INVENTION

1. Field of the Invention

The present invention relates generally to a socket. More particularly, the present invention relates to a socket, a method for manufacturing the socket, a device, and a method for compensating for differing coefficients of thermal expansion between a surface mounted socket and a printed circuit board.

2. Description of the Related Art

Dual in-line memory module (DIMM) sockets are used in computers to electrically connect memory modules to a processor package that is mounted on a printed circuit board. Currently, pins are the most popular means for physically attaching dual in-line memory module sockets to circuit boards. The pins fit through holes in the circuit board, and, typically, the pins are either soldered or press-fitted to the board, thereby forming a physical connection between the dual in-line memory module socket and the printed circuit board. The physical connection allows electrical signals to pass between the memory module residing in the dual in-line memory module socket and the processor package mounted on the printed circuit board. However, recent increases in processor performance are requiring higher electrical signal speeds to pass within a memory bus. As a result, electrical performances of the present dual in-line memory module socket pin design are insufficient. Therefore, the industry is moving towards new surface mounted lead designs to attach dual in-line memory module sockets to the circuit boards.

However, many manufacturing difficulties exist with surface mounted dual in-line memory module socket designs. The greatest challenge surrounds the differences in the coefficients of thermal expansion (CTE) between the dual in-line memory module socket housing material and the printed circuit board material. In manufacturing, a soldering reflow process is used to attach the dual in-line memory module socket to the circuit board. The soldering reflow process exposes the dual in-line memory module socket and the circuit board to extremely high temperatures. Because of the differences in the coefficients of thermal expansion, the dual in-line memory module socket housing and the circuit board expand at different rates during heating. Consequently, the circuit board tends to warp and create stress on the solder joints between the circuit board and the dual in-line memory module socket. The solder joint stress causes the joints to crack, which eventually results in broken electrical connections and memory bus failures after multiple on and off cycles.

Several solutions currently exist to address the warping problem arising from the differences in the coefficient of thermal expansion. One solution is to change the dual in-line memory module housing material to a material that has a similar coefficient of thermal expansion as the circuit board. Another solution is to apply a mechanical fixture and utilize thermal management techniques during the solder reflow process to control the warping. Yet another solution includes flattening the warped circuit board using a clamping fixture and an extended high temperature annealing of the solder joint stress. However, due to either unacceptable results or significant additional manufacturing costs, none of the solutions have been attractive.

BRIEF SUMMARY OF THE INVENTION

The illustrative embodiments provide a method for manufacturing a socket and attaching the socket to a printed circuit board. Surface mounted contacts for a bottom surface of a socket are provided. The surface mounted contacts are a plurality of conductive metal pads that directly attach to surface connections on a printed circuit board. An elongated housing is formed comprising at least two members that are coupled together and disposed to form an aperture in between the at least two members. At least one dimension of the at least two members is selected to compensate for a difference between coefficients of thermal expansion between the socket and the printed circuit board. Two latches are formed. The two latches are located at opposite ends of the elongated housing and are used to mechanically retain a module in the aperture. A clip is formed. The clip is an elongated arch in shape and is used to align the at least two members of the elongated housing and the surface mounted contacts with the printed circuit board during a solder reflow process to attach the socket to the printed circuit board. The at least two members and the surface mounted contacts are aligned with the printed circuit board using the clip so that the clip connects to the at least two members and the printed circuit board. The surface mounted contacts are coupled to the elongated housing. The surface mounted contacts extend from the aperture. In response to completing the solder reflow process, the clip is removed and the module is inserted into the aperture to form a finished product.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE INVENTION

Figure 1:
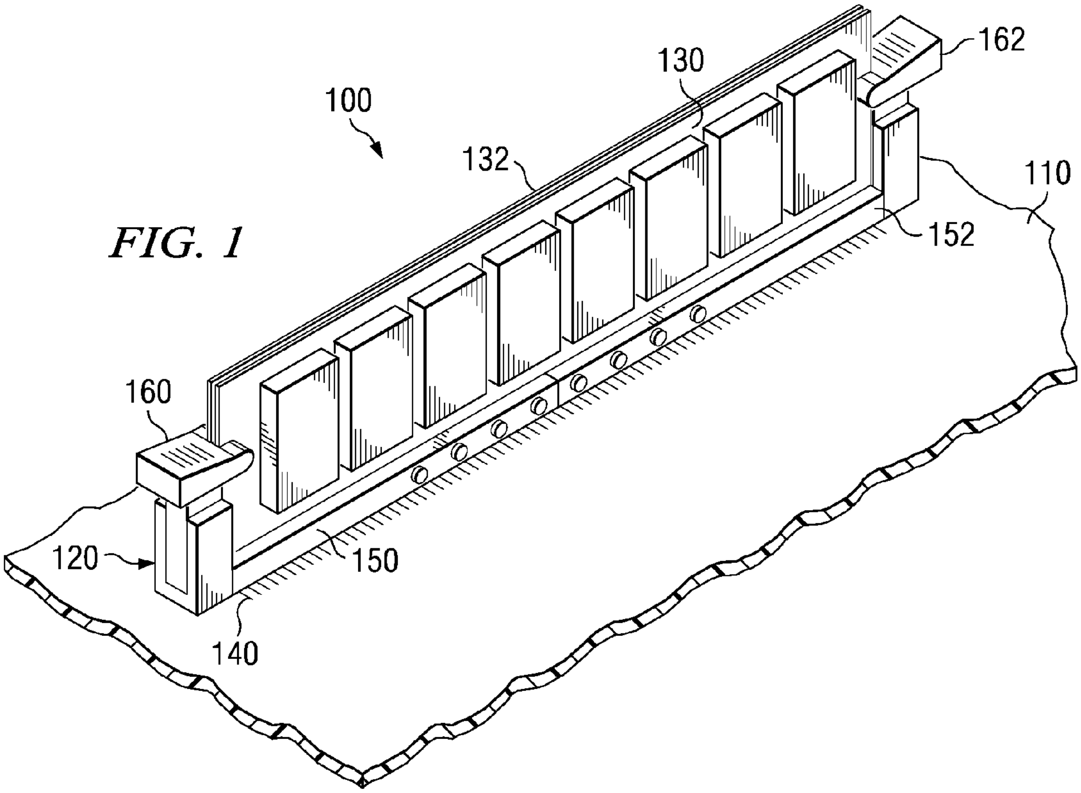
FIG. 1 is a diagram of a printed circuit board assembly, in which an illustrative embodiment can be implemented.

FIG. 1 is a diagram of a printed circuit board, in which an illustrative embodiment can be implemented. Printed circuit assembly 100 includes printed circuit board 110, socket 120, and modules 130 and 132. Printed circuit board 110 is a laminated board used to mechanically and electrically support electronic components. In the illustrative embodiment, printed circuit board 110 is made using photolithography with copper foil laminated on multiple layers of epoxy glass, composite material.

Socket 120 electrically connects a module, such as modules 130 and 132, to printed circuit board 110. In the illustrative embodiment, socket 120 is a dual in-line memory module (DIMM) socket. However, socket 120 is not limited to the illustrative embodiment and can include more or fewer modules. Socket 120 can also include different types of modules, such as a processor, a graphics card, a hard disk controller, or a sound card.

Socket 120 includes surface mounted contacts 140, elongated housing members 150 and 152, and latches 160 and 162. Surface connections on printed circuit board 110 are soldered to surface mounted contacts 140 to attach socket 120 directly to printed circuit board 110. Elongated housing members 150 and 152 linearly abut each other. An aperture exists in between elongated housing members 150 and 152, so that elongated housing members 150 and 152 can house modules 130 and 132. Latch 160 attaches to elongated housing member 150, while latch 162 connects to elongated housing member 152. Latches 160 and 162 are located at opposite ends of socket 120. Latches 160 and 162 mechanically retain modules 130 and 132 in socket 120.

Figure 2:
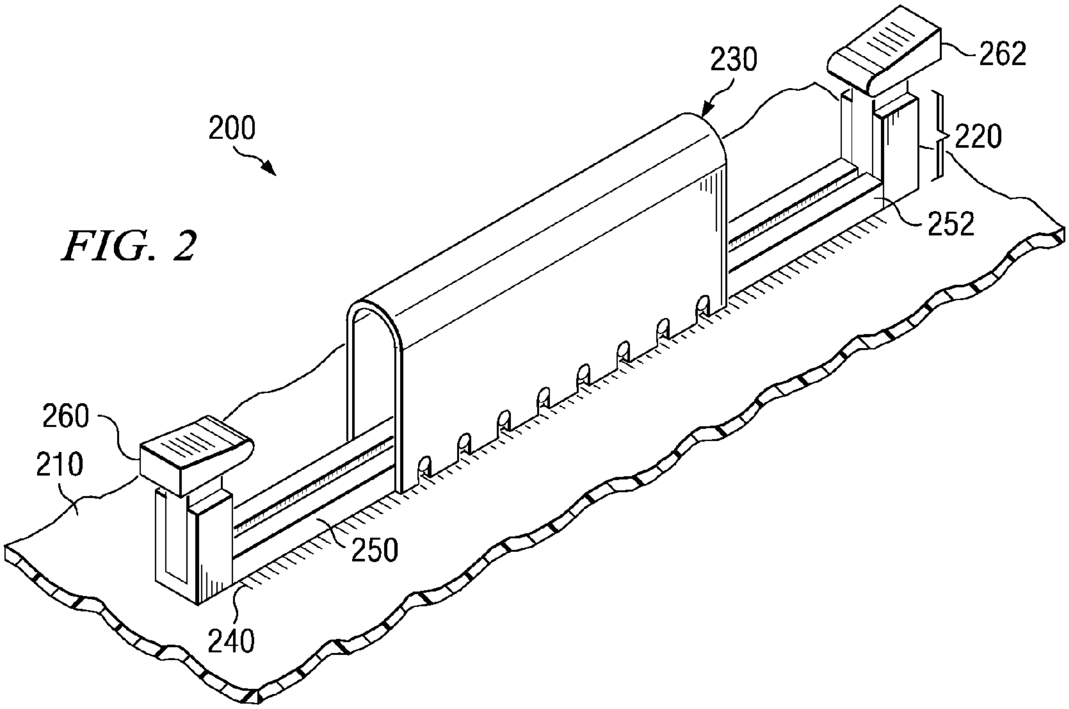
FIG. 2 is a diagram of a printed circuit board assembly with a clip, in which an illustrative embodiment can be implemented.

FIG. 2 is a diagram of a printed circuit board assembly with a clip, in which an illustrative embodiment can be implemented. Printed circuit assembly 200 includes printed circuit board 210, socket 220, and clip 230. Printed circuit board 210 is similar to printed circuit board 110 of FIG. 1 and is a laminated board used to mechanically and electrically support electronic components.

Socket 220 connects to printed circuit board 210 and is similar to socket 120 of FIG. 1. Socket 220 includes surface mounted contacts 240, elongated housing members 250 and 252, and latches 260 and 262. Surface connections on printed circuit board 210 are soldered to surface mounted contacts 240 to attach socket 220 directly to printed circuit board 210. Elongated housing members 250 and 252 linearly abut each other. An aperture exists in between elongated housing members 250 and 252, so that elongated housing members 250 and 252 can house a module, such as module 130 or 132 of FIG. 1. Latch 260 attaches to elongated housing member 250, while latch 262 connects to elongated housing member 252. Latches 260 and 262 are located at opposite ends of socket 220.

Clip 230 connects to elongated housing members 250 and 252. During manufacturing, clip 230 aligns elongated housing members 250 and 252 and surface mounted contacts 240 to printed circuit board 210. Typically, clip 230 is used in a manufacturing process and is not included in the finished product. However, printed circuit assembly 200 is not limited to a particular usage and can use clip 230 as part of a finished product or in any other process.

Figure 3:
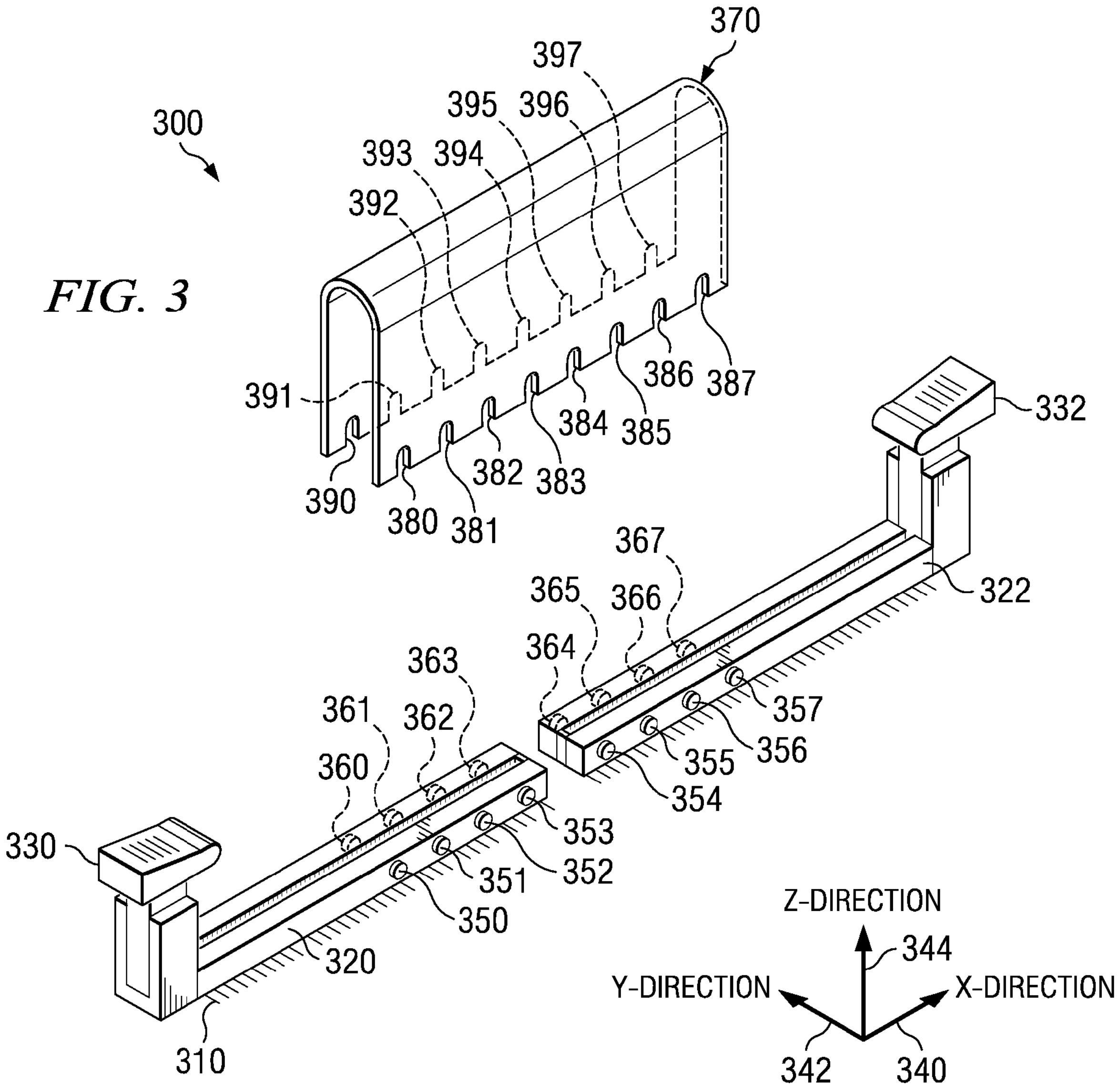
FIG. 3 illustrates an exploded view of a socket, in accordance with an illustrative embodiment.

FIG. 3 illustrates an exploded view of a socket, in accordance with an illustrative embodiment. Socket 300 is similar to socket 120 of FIG. 1 and socket 220 of FIG. 2 and is used to electrically connect modules, such as modules 130 and 132 of FIG. 1, to a printed circuit board, such as printed circuit board 110 of FIG. 1 or printed circuit board 210 of FIG. 2.

Socket 300 includes surface mounted contacts 310, elongated housing members 320 and 322, and latches 330 and 332. Surface mounted contacts 310 are similar to surface mounted contacts 140 of FIG. 1 and surface mounted contacts 240 of FIG. 2 and form the base of socket 300. Socket 300 can have any number of contacts. Typically, socket 300 will have anywhere between 240 to 300 individual contacts. Each contact is a pin, spring, or metal pad designed to contact a hole, metal pin, or spring, respectively, on a printed circuit board. Surface mounted contacts 310 are soldered onto a printed circuit board and form solder joints that physically connect socket 300 to the printed circuit board.

Elongated housing members 320 and 322 linearly abut each other to form a single housing unit. Elongated housing members 320 and 322 are similar to elongated housing members 150 and 152 of FIG. 1 and elongated housing members 250 and 252 of FIG. 2. An aperture exists in between elongated housing members 320 and 322, which can house a module or a number of modules. Latch 330 connects to elongated housing member 320, while latch 332 connects to elongated housing member 322. Latches 330 and 332 are located at opposite ends of socket 300. Latches 330 and 332 can mechanically retain a module in socket 300.

Typically, elongated housing members 320 and 322 are formed from a high temperature plastic resin, such as a liquid crystal polymer (LCP) or high temperature nylon. However, elongated housing members 320 and 322 may also be made from other materials or composite structures, such as metals or metal alloys with insulating coatings, and is not intended to limit the exemplary embodiments to any particular material. In the illustrative embodiment, elongated housing members 320 and 322 are formed from a liquid crystal polymer.

Elongated housing members 320 and 322 can be equally or unequally dimensioned in length (x-direction 340), width (y-direction 342), and height (z-direction 344), with each dimension ranging anywhere from 0.05 inches to 24 inches. Typically, elongated housing members 320 and 322 are proportionally longer in one direction than in the other two directions. Each elongated housing member, 320 and 332, can also be differently dimensioned. For example, elongated housing member 320 can be longer in length than elongated housing member 322. Alternatively, elongated housing member 320 can be shorter in length than elongated housing member 322. In the illustrative embodiment, elongated housing members 320 and 322 are the same dimensions and proportionally longer in length than in width and height. Specifically, in the illustrative embodiment, elongated housing members 320 and 322 are each 3.1 inches in length, 0.3 inches in width, and 0.25 inches in height.

In the illustrative embodiment, elongated housing members 320 and 322 compensate for the differences in the coefficients of thermal expansion (CTE) between socket 300 and a printed circuit board. Coefficient of thermal expansion is a measure of how much a particular material expands or contracts when the particular material is exposed to different temperatures. Every material possesses unique expansion characteristics and has a different coefficient of thermal expansion factor. For example, liquid crystal polymer has a coefficient of thermal expansion of two to five parts per million (PPM) per degrees Celsius, while copper has a coefficient of thermal expansion of ten to fifteen parts per million per degrees Celsius.

Coefficient of thermal expansion is a function of dimensional size. Thus, how greatly temperature changes affect a particular component directly depends on the dimensional size of the component. Therefore, temperature changes affect a large component to a greater extent than a small component and, conversely, do not impact a small component as much as a large one. Moreover, a component that is dimensionally longer in one direction than in another is affected to a greater extent in the longer direction than in the other two directions. For example, in the illustrative embodiment, socket 300 is proportionally longer in length than in width and height. Consequently, socket 300 is affected by temperature changes in the length dimension more than in the width and height dimensions.

The temperature and dimensional size relationships also exist between components fabricated from different materials. A component made from two large-sized materials is more greatly affected than two small-sized materials. Likewise, a component made from two materials that are both longer in one dimension is affected more in the longer dimension than in the other two dimensions.

Problems associated with mismatched coefficients of thermal expansion are reduced in proportion to the amount a particular component is reduced in dimensional size. Therefore, reducing the size of a component mitigates problems associated with changes in temperature. Moreover, a reduction in size in the largest dimension of a component provides the most relief to the problems associated with mismatched coefficients of thermal expansion. In the illustrative embodiment, socket 300 is divided into two separate members: elongated housing members 320 and 322. By dividing socket 300 into two members, the problems associated with mismatched coefficients of thermal expansion is alleviated.

In the illustrative embodiment, socket 300 is divided into two members. However, socket 300 is not limited to the illustrative embodiment and may be divided into any number of members. In theory, socket 300 may be divided into an infinite number of individual members, thereby effectively eliminating the impact of temperature changes altogether. However, constraints on cost and manufacturability limit the number of members that socket 300 could practically be divided into.

In the illustrative embodiment, mounting members 350 through 353 are disposed on an external edge of elongated housing member 320, and mounting members 360 through 363 are disposed on an opposite external edge of elongated housing member 320. Mounting members 354 through 357 are disposed on an external edge of elongated housing member 322, and mounting members 364 through 367 are disposed on an opposite external edge of elongated housing member 322.

In the illustrative embodiment, mounting members 350 through 357 and 360 through 367 are circular. Additionally, in the illustrative embodiment, mounting members 350 through 357 and 360 through 367 are linearly distributed towards the center of the length of socket 300. However, mounting members 350 through 357 and 360 through 367 are not limited to the illustrative embodiment and can take any shape, such as a triangle, square, or rectangle, and be distributed along the entire length of elongated housing members 320 and 322, respectively. Additionally, mounting members 350 through 357 and 360 through 367 are not limited to the distribution pattern as shown in the illustrative embodiment. Mounting members 350 through 357 and 360 through 367 may be distributed along the entire length or a different part of elongated housing members 320 and 322.

In the illustrative embodiment, the same number of mounting members exists on each elongated housing member 320 and 322. However, elongated housing member 320 can have a different number of mounting members than elongated housing member 322. Moreover, in the illustrative embodiment, the same number of mounting members exists on each external edge of elongated housing members 320 and 322. However, a different number of mounting members may exist on each external edge as long as the number of mounting members corresponds with the number of slots on each edge of clip 370. Additionally, in the illustrative embodiment, mounting members 350 through 357 and 360 through 367 extend out of elongated housing members 320 and 322, respectively. However, mounting members 350 through 357 can take any form, such as a recessed member or an aperture, so long as clip 370 can attach to elongated housing members 320 and 322.

Alignment of elongated housing members 320 and 322 is maintained during the solder reflow process using clip 370. Clip 370 can be fabricated from any mechanically supportive material, such as a plastic resin, a metal or metal alloy, or a combination of a metal and plastic resin. Typically, clip 370 is made from a metal, such as stainless steel or brass. In the illustrative embodiment, clip 370 is made from stainless steel.

In the illustrative embodiment, clip 370 is shaped like an elongated arch and includes slots 380 through 387 disposed along a bottom edge of clip 370. Slots 390 through 397 are disposed along an opposite bottom edge of clip 370. Clip 370 is not limited to the illustrative embodiment and can take any shape, as long as clip 370 aligns elongated housing member 320 with elongated housing member 322.

When clip 370 is attached to elongated housing members 320 and 322, slots 380 through 387 mate with mounting members 350 through 357, and slots 390 through 397 mate with mounting members 360 through 367. In the illustrative embodiment, slots 380 through 387 and 390 through 397 are shaped like an arch. Additionally, in the illustrative embodiment, slots 380 through 387 and 390 through 397 are through-holes. However, slots 380 through 387 and 390 through 397 are not limited to the illustrative embodiment and can take any shape and form that corresponds to mounting members 350 through 357 and 360 through 367, respectively.

In use, clip 370 is attached to the elongated housing members 320 and 322 prior to the solder reflow process. After the solder reflow process is completed, clip 370 is removed and a module can be inserted into socket 300 to form the finished product. However, clip 370 is not limited to a particular usage and can be used as part of a finished product or in conjunction with any other process.

Figure 4:
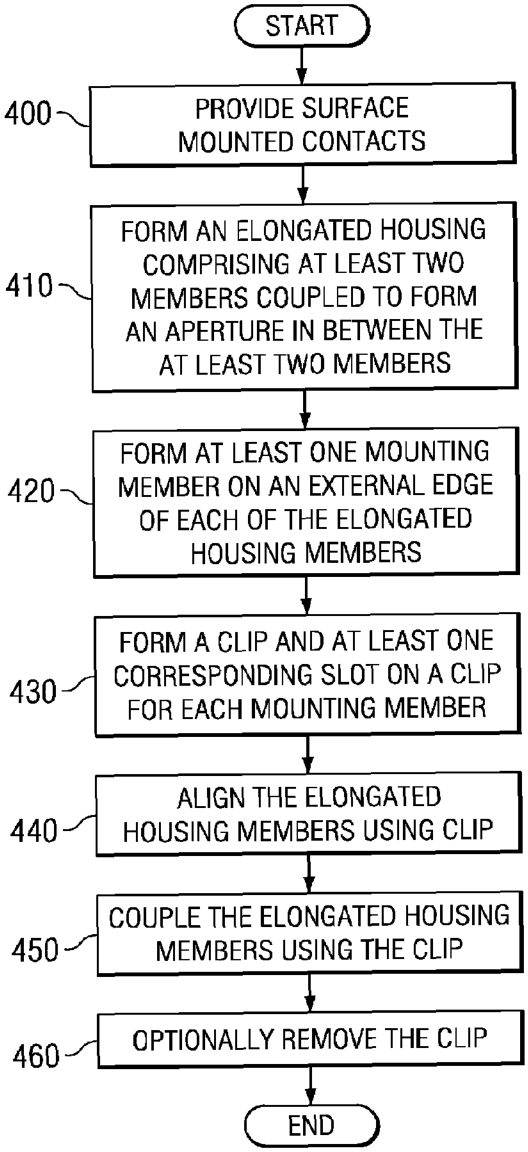
FIG. 4 is a flowchart illustrating the process for manufacturing a socket, in accordance with an illustrative embodiment.

FIG. 4 is a flowchart illustrating the process for manufacturing a socket, in accordance with an illustrative embodiment. The following process is exemplary only and the order of each step can be interchanged without deviating from the scope of the invention. The process begins with providing surface mounted contacts (step 400). An elongated housing comprising at least two members is then formed (step 410). The at least two members are coupled together and disposed to form an aperture in between the two members. At least one mounting member is then formed on an external edge on each of the elongated housing members (step 420). A clip and at least one slot corresponding to at least one mounting member on each of the elongated housing members are then formed (step 430). The elongated housing members are then aligned (step 440) and coupled together using the clip (step 450). The clip is then optionally removed (step 460), with the process terminating thereafter.

Figure 5:
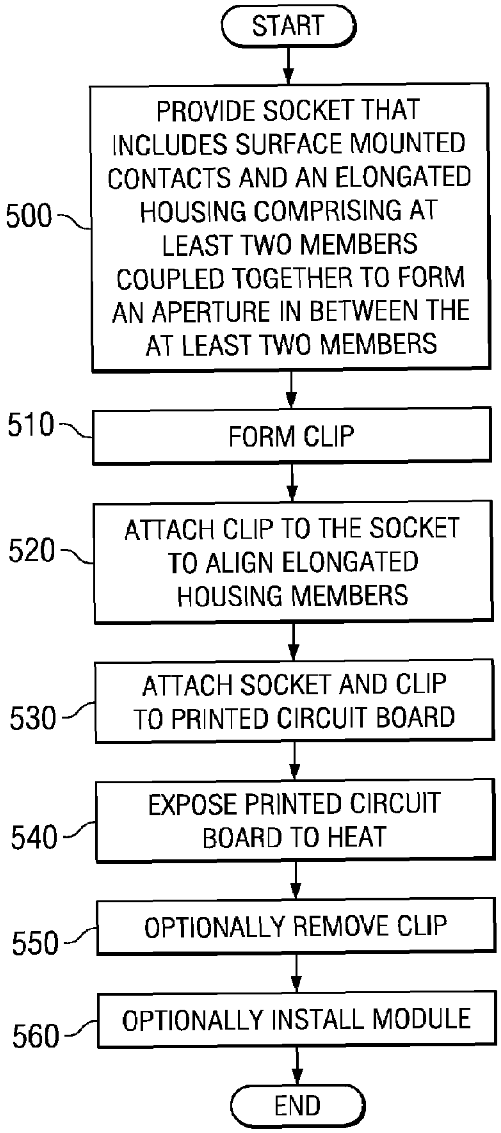
FIG. 5 is a flowchart illustrating a method for compensating for a difference in the coefficients of thermal expansion between a socket and a printed circuit board, in accordance with an illustrative embodiment.

FIG. 5 is a flowchart illustrating a method for compensating for a difference in the coefficients of thermal expansion between a socket and a printed circuit board, in accordance with an illustrative embodiment. The following process is exemplary only and the order of each step can be interchanged without deviating from the scope of the invention. The process begins with providing a socket that includes surface mounted contacts and an elongated housing (step 500). The elongated housing comprises at least two members that are coupled together and disposed to form an aperture in between the at least two members. The surface mounted contacts extend from the aperture. A clip is then formed (step 510) and attached to the socket to align the elongated housing members (step 520). The socket and clip are then attached to a printed circuit board (step 530). The printed circuit board is then exposed to heat during a solder reflow process (step 540). The clip is then optionally removed from the printed circuit board (step 550) and a module is optionally installed on the printed circuit board (step 560), with the process terminating thereafter.

The illustrative embodiment provides a socket, a method of manufacturing the socket, a device, and a method for compensating for a difference in the coefficients of thermal expansion between the socket and a printed circuit board. The socket includes surface mounted contacts and an elongated housing. The elongated housing includes at least two members that are coupled together and disposed to form an aperture in between the at least two members. The surface mounted contacts extend from the aperture. At least one dimension of the at least two members is selected to compensate for a difference between the coefficients of thermal expansion between the socket and a printed circuit board.

A clip is used to align the elongated housing members during the solder reflow process. At least one mounting member is disposed on an external edge on each of the at least two members. At least one slot for every mounting member is disposed on the bottom edge of the clip. The clip connects to the elongated housing members by connecting the mounting member to the slot. During manufacturing, the clip is attached to the socket while the printed circuit board is exposed to heat. The clip is optionally removed after the socket is exposed to the heat and prior to installation of one or more modules.

The elongated housing members compensate for the differences in the coefficients of thermal expansion between a socket and a printed circuit board. As a result, the division of a socket into smaller members reduces warping of the printed circuit board, decreases solder joint stress between the surface mounted contacts and the printed circuit board, and eliminates exposure to broken electrical connections and memory bus failures.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for manufacturing a socket and attaching the socket to a printed circuit board, the method comprising:

providing surface mounted contacts for a bottom surface of a socket, wherein the surface mounted contacts are a plurality of conductive metal pads that directly attach to surface connections on a printed circuit board;

forming an elongated housing comprising at least two members that are coupled together and disposed to form an aperture in between the at least two members, wherein at least one dimension of the at least two members is selected to compensate for a difference between coefficients of thermal expansion between the socket and printed circuit board;

forming two latches, wherein the two latches are located at opposite ends of the elongated housing, and wherein the two latches are used to mechanically retain a module in the aperture;

forming a clip, wherein the clip is an elongated arch in shape, and wherein the clip is used to align the at least two members of the elongated housing and the surface mounted contacts with the printed circuit board during a solder reflow process to attach the socket to the printed circuit board;

aligning the at least two members and the surface mounted contacts with the printed circuit board using the clip so that the clip connects to the at least two members and the printed circuit board;

coupling the surface mounted contacts to the elongated housing, wherein the surface mounted contacts extend from the aperture; and responsive to completing the solder reflow process, removing the clip and inserting the module into the aperture to form a finished product.

2. The method of claim 1, further comprising:

forming a mounting member disposed on an external edge on each of the at least two members, wherein the mounting member is circular in shape;

forming a slot disposed along each bottom edge of the clip, wherein the slot is an arch in shape and is a through hole, and wherein the slot corresponds to the mounting member, and wherein the slot connects to the mounting member; and connecting the slot to the mounting member.

3. The method of claim 2, wherein the mounting member is one of a plurality of mounting members, and wherein the slot is one of a plurality of slots.

4. The method of claim 1, wherein the clip comprises metal.

5. A method for compensating for differing coefficients of thermal expansion between a socket and a printed circuit board, the method comprising:

providing a socket comprising:

surface mounted contacts on a bottom surface of the socket, wherein the surface mounted contacts are a plurality of conductive metal pads that directly attach to surface connections on a printed circuit board;

an elongated housing comprising at least two members that are coupled together and disposed to form an aperture in between the at least two members, wherein at least one dimension of the at least two members is selected to compensate for a difference between coefficients of thermal expansion between the socket and the printed circuit board; and latches, wherein one latch is located at each opposite end of the elongated housing, and wherein the latches mechanically retain a module in the aperture; and forming a clip, wherein the clip is an elongated arch in shape, and wherein the clip is used to align the at least two members of the elongated housing and the surface mounted contacts with the printed circuit board;

aligning the at least two members and the surface mounted contacts with the printed circuit board using the clip so that the clip connects to the at least two members and the printed circuit board;

exposing the printed circuit board to a high temperature to connect the socket to the printed circuit board; and responsive to connecting the socket to the printed circuit board, removing the clip.

* * * * *